(12) United States Patent
McDaniel et al.

(10) Patent No.: US 9,413,109 B1
(45) Date of Patent: Aug. 9, 2016

(54) METHOD AND SYSTEM FOR COUPLING A CABLE CONNECTOR TO A CIRCUIT BOARD

(71) Applicant: EMC Corporation, Hopkinton, MA (US)

(72) Inventors: Ryan C. McDaniel, Hopkinton, MA (US); Jeffrey M. Lewis, Maynard, MA (US); Keith L. Daly, Shrewsbury, MA (US)

(73) Assignee: EMC CORPORATION, Hopkinton, MA (US)

( * ) Notice: Subject to any disclaimer, the term of this patent is extended or adjusted under 35 U.S.C. 154(b) by 0 days.

(21) Appl. No.: 14/664,593

(22) Filed: Mar. 20, 2015

(51) Int. Cl.
*H01R 13/64* (2006.01)
*H01R 13/631* (2006.01)
*H05K 3/32* (2006.01)

(52) U.S. Cl.
CPC ............... *H01R 13/631* (2013.01); *H05K 3/32* (2013.01)

(58) Field of Classification Search
CPC .... H01R 13/631; H01R 12/592; G06F 1/181; H05K 3/32
USPC ......................................................... 439/374
See application file for complete search history.

(56) References Cited

U.S. PATENT DOCUMENTS

| | | | | |
|---|---|---|---|---|
| 6,733,325 B2* | 5/2004 | Sakai | ................... | H01R 12/592 439/493 |
| 7,602,611 B2* | 10/2009 | Peng | ....................... | G06F 1/181 361/728 |
| 8,872,025 B2* | 10/2014 | Tamai | ................... | B62D 5/0406 174/50.5 |
| 8,911,246 B2* | 12/2014 | Carnevali | .............. | G06F 1/1632 439/170 |
| 9,152,177 B2* | 10/2015 | Feldstein | ................ | F16M 11/22 |
| 2008/0183933 A1* | 7/2008 | Peng | ....................... | G06F 1/181 710/302 |

* cited by examiner

*Primary Examiner* — Jean F Duverne
(74) *Attorney, Agent, or Firm* — Day Pitney LLP

(57) ABSTRACT

The present invention provides a computer system comprising an enclosure adapted to contain one or more printed circuit boards, the enclosure including a back plane having a recessed port for coupling a data communication cable to a printed circuit board, the recessed port including a receptacle adapter coupled to the printed circuit board adapted to receive a connector of the data communication cable, and a perpendicular clearance space for facilitating alignment of the connector of the data communication cable with the receptacle.

20 Claims, 6 Drawing Sheets

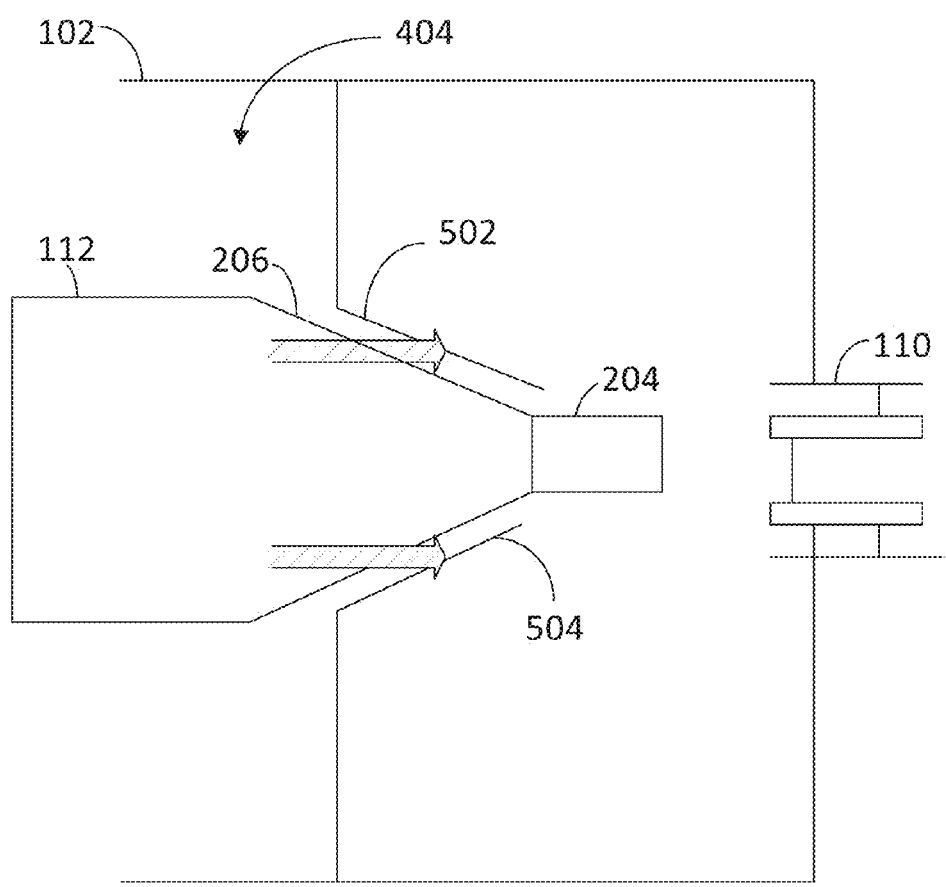

US 9,413,109 B1

METHOD AND SYSTEM FOR COUPLING A CABLE CONNECTOR TO A CIRCUIT BOARD

FIELD OF THE INVENTION

The present invention relates to computer systems, and in particular, relates to coupling a cable connector, such as a Serial SCSI cable connector, to a computer system circuit board.

BACKGROUND OF THE INVENTION

Enterprise computer systems with high capacity are typically configured in enclosures commonly termed 'racks' or 'chassis'. The racks enclose one or more printed circuit boards (PCBs) that include the processing and storage components of the computer system. The PCBs may receive and output data at high rates over cables that couple the PCBs to external systems and components. The coupling between a PCB and a cable typically comprises an adapter receptacle positioned on the PCB and an interconnect (connector) positioned at the termination of the cable. One of the most commonly used protocols for data transmission to/from computer storage devices is the Serial Attached SCSI (Small Computer System Interface) (collectively, "SAS") protocol. The SAS specification defines an external connector and cabling system for box-to-box connections required by SCSI applications. At the physical layer the SAS specification defines connectors, voltage levels and data bit rates, with a recent specification (SAS-3.0) providing for 12 Gbit/s transmission rates. The cable connector developed according to the SAS-3.0 specification is termed the Mini-SAS HD connector (SFF-8644). This connector includes a plug body portion that, when inserted into a receptacle positioned at the edge of the chassis, as is conventionally done, may extend up to 32 mm beyond the enclosure. As this length is in effect an addition to the depth dimensions of the enclosure, it increases the total depth which must be available to fit an enclosure in a designated space. In addition, the minimal bend radius of the cable extending from the connector necessarily adds to the effective depth of the enclosure. For example, the Cayenne Disk Array Enclosure has a cabinet depth of 34.5 inches. If it is desired to fit the enclosure in a rack with a total depth of 36.5 inches, the length of the body portion extending from the enclosure and the bend radius of the cable would not allow the enclosure to fit into this solution depth. Shortening the entire enclosure may not be possible as room is needed for logic hardware, disk drives and fans. Additionally, in the conventional configuration, the Mini-SAS HD plug and receptacle lack guidance and alignment features for blind mating which can make installation difficult.

What is needed is a coupling system and method which does not unduly increase enclosure space requirements, and is relatively easy to install.

SUMMARY OF THE INVENTION

Embodiments of the present invention provide a computer system comprising an enclosure adapted to contain one or more printed circuit boards, the enclosure including a back plane having a recessed port for coupling a data communication cable to a printed circuit board, the recessed port including a receptacle adapter coupled to the printed circuit board adapted to receive a connector of the data communication cable, and a perpendicular clearance space for facilitating alignment of the connector of the data communication cable with the receptacle.

Embodiments of the present invention also provide a method of coupling a connector of a data communication cable to a computer system having a printed circuit board contained within an enclosure comprising providing an opening in the enclosure for a receptacle adapter coupled to the printed circuit board, recessing the opening within the enclosure so as to compensate for any additional depth added to the computer system by a minimal bend radius of the data communication cable, and aligning the cable connector in the opening with the receptacle adapter so as to securely couple the cable connector to the receptacle adapter.

Other features and advantages of the present invention will become apparent from the following description of the invention that refers to the accompanying drawings.

BRIEF DESCRIPTION OF THE DRAWINGS

The invention will now be described in greater detail in the following detailed description with reference to the drawings in which:

FIG. 5A is a schematic side view of the recessed port section of an enclosure according to an exemplary embodiment of the present invention.

DETAILED DESCRIPTION OF THE INVENTION

Figure 1:
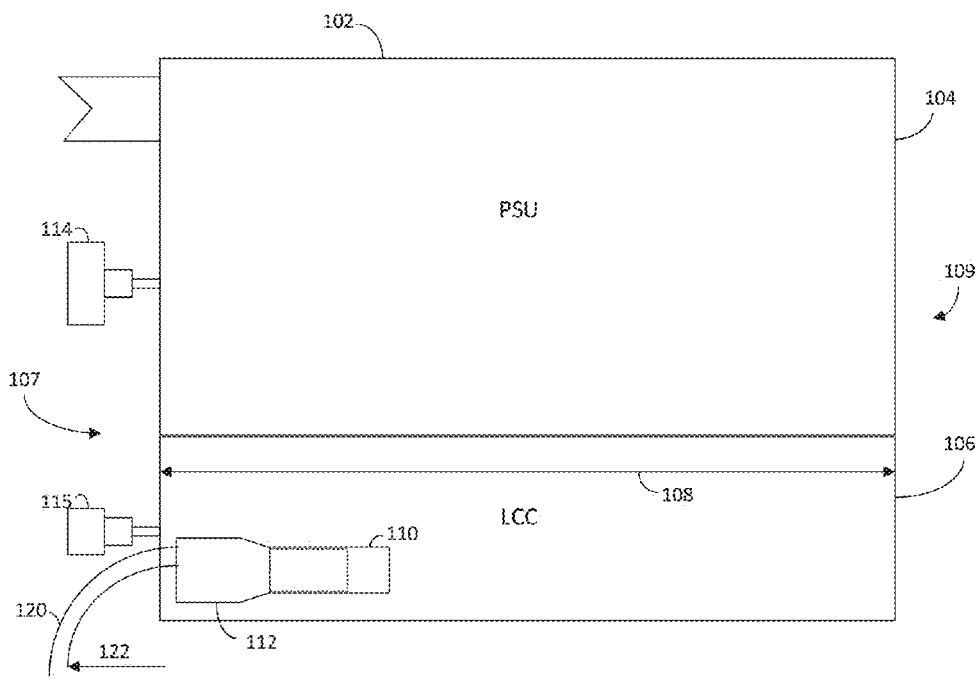
FIG. 1 is a schematic side view of a computer system enclosure of an according to an exemplary embodiment of the present invention.

The foregoing summary, as well as the following detailed description of the embodiments of the present invention, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present.

FIG. 1 is a schematic side view of a computer system 100 enclosure according to embodiments of the present invention. The computer system 100 includes a rectangular enclosure 102 having a power supply unit portion 104 and a line card chassis 106. Although only one line card chassis 106 is shown, it should be understood that the enclosure 102 may be larger and encompass a plurality of line card chassis. The depth dimension 108 of the enclosure 102 is commonly approximately 34 to 34.5 inches and facility spaces are designed to accommodate enclosures of this depth. The line card chassis 106 is adapted to contain a 'line card', which is a printed circuit board (PCB) including components for interfacing processing and storage components of a computer system with the physical layer of a data communications network. The communication network may be a local area network (LAN), wide area network (WAN), or a carrier telephone network. The line card chassis 106 includes a back panel 107 having a physical port receptacle 110 for coupling with a cable connector 112. The back panel 107 of line card chassis 106 may also include knobs 114, 115 or similar fixtures for engaging/disengaging a line card from the enclosure 102. On the opposite side of the line card chassis 106, a front panel 109 may include a number of drive slots for insertion of hard drives and one or more fans (not shown in FIG. 1) for cooling the components of the circuit boards.

According to embodiments of the present invention, the cable connector 112 is inserted fully within the rectangular space defined by the enclosure 102. In some embodiments, where the cable connector is implemented using an SFF-8644 mini-SAS HD (High Density) connector, the connector is inserted between over two inches (e.g., in a range of 2.0 to 2.5 inches) within the enclosure, as is shown in FIG. 1. In some embodiments this is accomplished by recessing the receiving port of the enclosure as shown, for example, in FIG. 4 discussed in greater detail below. The data communication cable 120 which extends from the connector 102 has a minimal bend radius 122 which adds to the effective depth of the enclosure 102. By fully inserting the connector 112 into the enclosure along with a short section of the cable 120 that minimal bend radius can be fully compensated for, allowing the computer system 100 to be positioned in facility spaces without having to account for the additional depth added by the bending of the cable.

Figure 2:
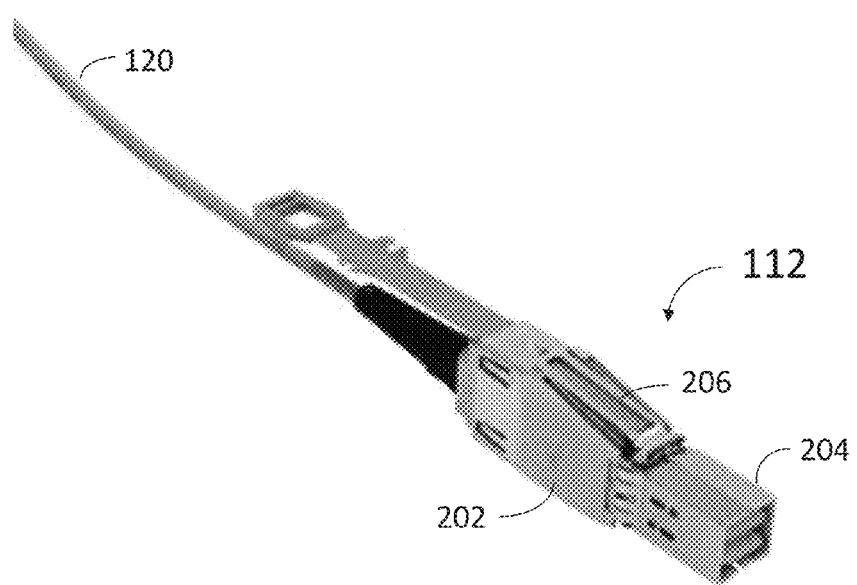
FIG. 2 is a photograph of an example mini-SAs HD cable connector 112 that may be used in embodiments of the present invention.

FIG. 2 is a photograph of an example mini-SAs HD cable connector 112 that may be used in the context of the present invention. As shown, the connector 112 includes two portions, a body section 202 and a plug adapter section 204. The connector 112 may be coupled to a passive copper cable assembly or, alternatively may be coupled to an active optical cable (AOC) assembly. The body section 204 has angled surfaces (e.g., 206) which taper down to the plug adapter 204. The plug adapter 204 is design according to the SFF 8644 specification to engage with the corresponding SFF-8644 receptacle 110 within enclosure 102. The plug adapter 204 may accommodate either 4 channels (4×) (shown) or 8 channels (8×).

Figure 3:
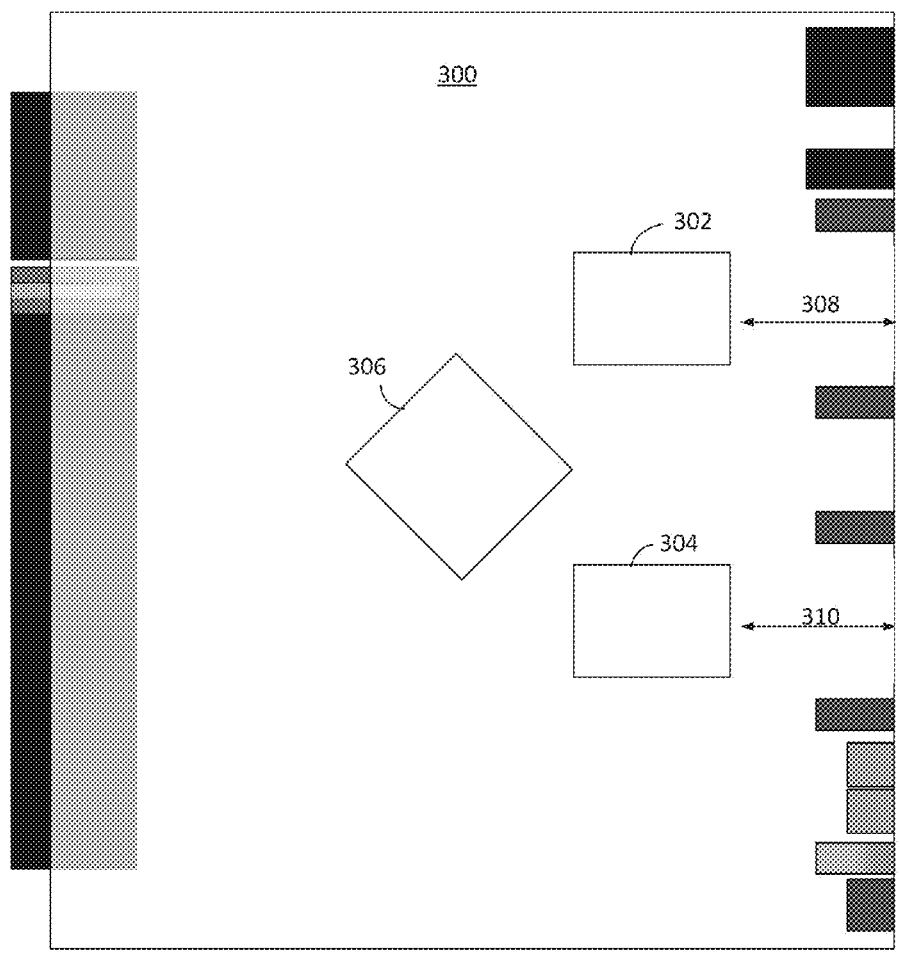
FIG. 3 is a schematic diagram of an example line card printed circuit board according to an exemplary embodiment of the present invention.

FIG. 3 is a schematic diagram of a line card PCB 300 that may be used in the computer system 100 according to embodiments of the present invention. The line card 300 includes two receptacle adapters 302, 304 each coupled to an SAS expander 306. In some embodiments, the receptacle adapters 302, 304 are implemented as mini SAS HD adapters according to the SFF 8644 specification. The SAS expander 306 is an intermediary device between end devices that enables the potential size of an SAS domain, i.e., the number of ports available for data transmission, to be greatly increased, such as by 2-3 orders of magnitude. SAS expanders thereby enable storage capacity beyond the conventional number of drives (e.g., 8, 16, 24) using a single controller. It is noted that the line card 300 typically includes a number of additional electronic components and end devices known to those of skill in the art and not described in further detail herein.

In embodiments implementing the SFF-8644 SAS specification, each of the receptacle adapters 302, 304 may comprises a housing with 36-position receptacle ports and compliant pin contacts on 0.75-mm centerline spacing. Each receptacle port has two card slots that accept a 1.0±0.10-mm thick integrated circuit card housed in the mating module. The cage assembly features PCB compliant pin contacts and fasteners for mechanical retention.

Figure 4:
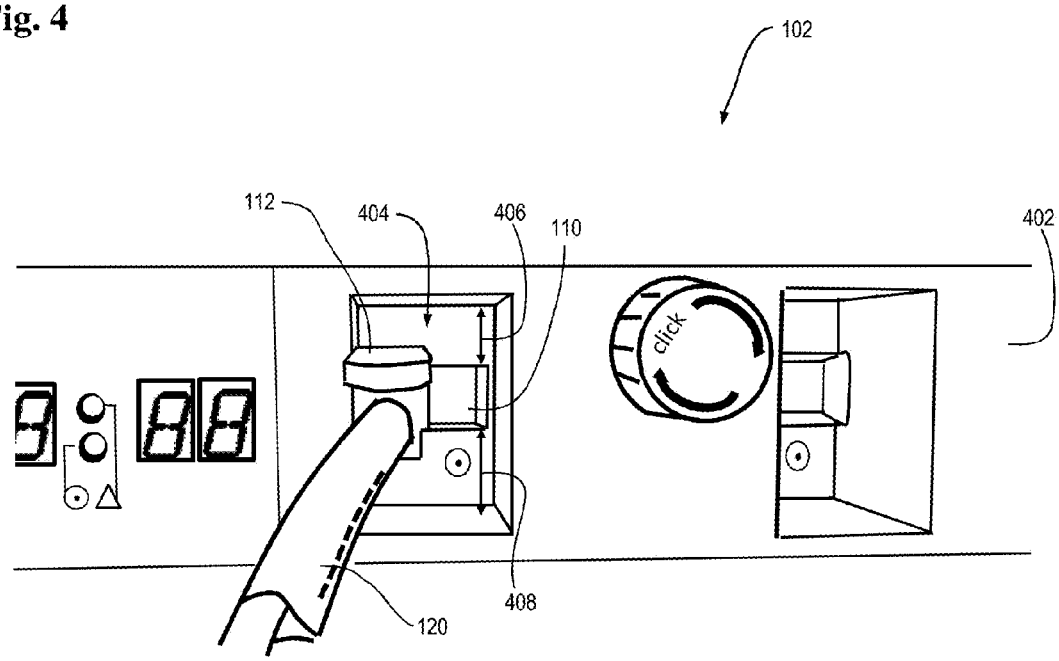
FIG. 4 is a photograph of an example back panel of an enclosure according to an exemplary embodiment of the present invention.
Figure 5B:
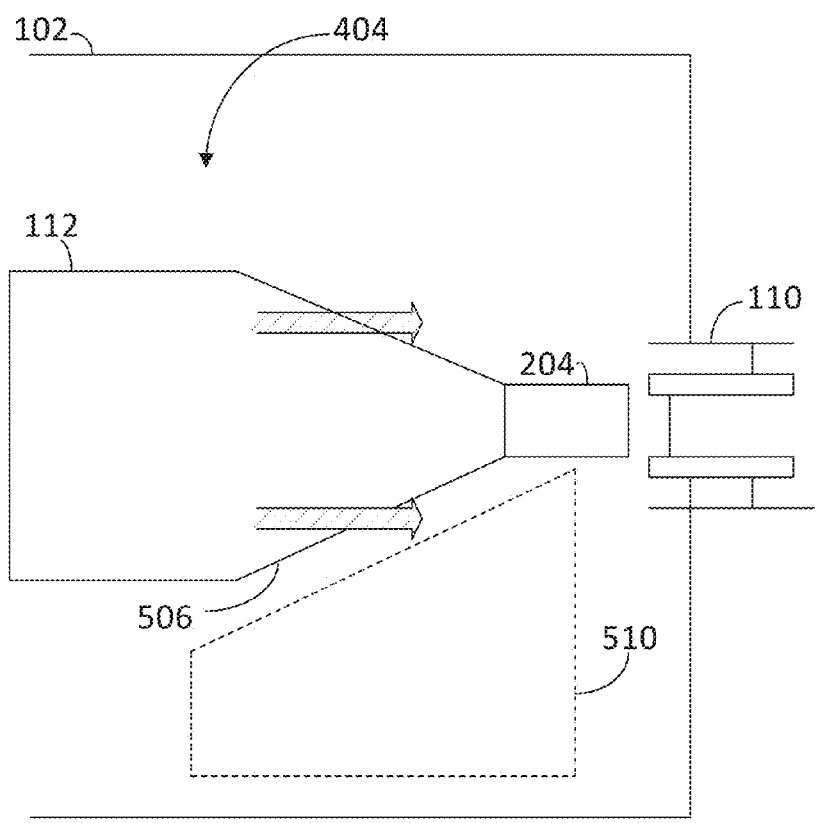
FIG. 5B is a schematic side view of the recessed port section of an enclosure according to an alternative embodiment of the present invention including adjustable alignment ramps.

As can be discerned in FIG. 3, the line card 300 is indented 308, 310 at the respective positions of the receptacle adapters 302, 304. The receptacle adapters 302, 304 are fixed onto the line card 300 behind the indents, with the result that the adapters are moved backwards away from the edge of the line card 300 in accordance with the objective providing a cable interconnect further within the enclosure. It is found that the resulting loss of space due to the indents on the line card 300 is not prohibitive and the various components on the on the line card can be accommodated in the remaining space FIG. 4 is a photograph of an example back panel 402 of an enclosure 102 according to an embodiment of the present invention. The back panel 402 includes a recessed opening or port section 404 into which a cable connector 112 may be fully inserted into a receptacle adapter 110 as described above. The recessed section 404 comprises an expanded opening including vertical clearance spaces 406, 408 above and below the cable connector 112. The clearance spaces allow visual alignment of the cable connector 112 and receptacle adapter 110, facilitating ease of insertion and installation. Additional means for facilitating alignment and insertion are shown in FIGS. 5A and 5B. FIG. 5A is a schematic side view of the recessed port section of an enclosure according to an embodiment of the present invention. As illustrated, when attempting to couple the cable connector 112 to the receptacle adapter 110, as the cable connector 112 is brought forward within the recessed port section 404, the angled surface of the connector body (e.g., 206) comes into contact with corresponding angled surfaces 502, 504 fixed within the port section 404, automatically guiding and aligning the plug adapter 204 of the connector with the receptacle adapter 110.

Similarly, in the alternative embodiment shown in FIG. 5B, rather than fixed angled surfaces, the recessed port section 404 may include one or more adjustable ramps 510 which may be adjustable laterally (perpendicular to the page). Contact between the lower angled surface of the connector body 506 guides the connector 112 upwards, aligning the plug adapter 204 of the connector with the with the receptacle adapter 110.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A computer system, comprising:
   an enclosure adapted to contain one or more printed circuit boards, the enclosure including a back plane having an inwardly extending recessed port for externally coupling a data communication cable to a printed circuit board disposed within the enclosure, the recessed port:
   configured for retaining a receptacle adapter coupled to the printed circuit board adapted to receive a connector of the data communication cable; and
   comprising a perpendicular clearance space in the recessed port for facilitating alignment of the connector of the data communication cable with the receptacle.

2. The computer system of claim 1, wherein the recessed port further comprises one or more angled surfaces adapted to contact a cooperating angled surface of the connector so as to further facilitate alignment of the connector with the receptacle adapter.

3. The computer system of claim 1, wherein the recessed port further comprises an adjustable ramp adapted to contact an angled surface of the connector so as to further facilitate alignment of the connector with the receptacle adapter.

4. The computer system of claim 1, wherein the receptacle adapter is adapted to receive a mini SAS HD cable connector.

5. The computer system of claim 1, wherein a depth of the inwardly extending recessed port compensates for any additional depth added to the computer system by a minimal bend radius of the data communication cable.

6. The computer system of claim 1, further comprising:
an SAS expander positioned on the printed circuit board;
wherein the receptacle adapter is positioned laterally to and coupled to the SAS expander on the printed circuit board.

7. A method of coupling a connector of a data communication cable to a computer system having a printed circuit board contained within an enclosure comprising:
providing an opening in the enclosure for a receptacle adapter coupled to the printed circuit board;
recessing the opening by inwardly extending the opening within the enclosure so as to compensate for any additional depth added to the computer system by a minimal bend radius of the data communication cable; and
aligning the connector in the opening with the receptacle adapter so as to securely couple the connector to the receptacle adapter.

8. The method of coupling a connector of a data communication cable to a computer system of claim 7, wherein the aligning the connector in the opening comprises providing angled surfaces adapted to contact a cooperating angled surface of the connector so as to further facilitate alignment of the connector with the receptacle adapter.

9. The method of coupling a connector of a data communication cable to a computer system of claim 7, wherein the aligning the connector in the opening comprises providing an adjustable ramp adapted to contact an angled surface of the connector so as to further facilitate alignment of the connector with the receptacle adapter.

10. The method of coupling a connector of a data communication cable to a computer system of claim 7, wherein the receptacle adapter is adapted to receive a mini SAS HD cable connector.

11. The method of coupling a connector of a data communication cable to a computer system of claim 7, further comprising recessing the opening to a depth that compensates for any additional depth added to the computer system by a minimal bend radius of the data communication cable.

12. The method of coupling a connector of a data communication cable to a computer system of claim 11, wherein the minimal cable bend radius of the data communication cable lies in a range of from 2.0 to 2.5 inches.

13. The method of coupling a connector of a data communication cable to a computer system of claim 7, further comprising providing a perpendicular clearance space in the opening for facilitating alignment of the connector with the receptacle.

14. An enclosure for a computer system, the enclosure comprising:
a receiving area for disposed therein, the receiving area configured for receiving a line card chassis comprising at least one line card, the line card comprising a receptacle adapter configured for externally receiving a cable connector of a communications cable;
a back plane having an inwardly extending recessed port for receiving the communications cable and providing access to the receptacle adapter for connection thereto.

15. The enclosure of claim 14, wherein a recessed section of the recessed port comprises a laterally adjustable ramp configured to align a connector of the communications cable with the receptacle adapter.

16. The enclosure of claim 14, wherein the receptacle adapter comprises an interface with at least one of processing components and storage components of the computer system.

17. The enclosure of claim 14, wherein at least one of the enclosure and the line card chassis comprise at least one fixture for engagement and disengagement.

18. The enclosure of claim 14, further configured for receiving at least one of a hard drive and a fan.

19. The enclosure of claim 14, wherein the receptacle adapter is configured for receiving one of a passive copper cable assembly and an active optical cable assembly.

20. The enclosure of claim 14, further configured for being mounted in a standardized computer rack.

* * * * *